(12) United States Patent
Fornara (10) Patent No.: US 10,283,648 B2
(45) Date of Patent: May 7, 2019

(54) PN JUNCTION-BASED ELECTRICAL FUSE USING REVERSE-BIAS BREAKDOWN TO INDUCE AN OPEN CONDUCTION STATE

(71) Applicant: STMicroelectronics (Rousset) SAS, Rousset (FR)

(72) Inventor: Pascal Fornara, Pourrieres (FR)

(73) Assignee: STMicroelectronic (Rousset) SAS, Rousset (FR)

( * ) Notice: Subject to any disclaimer, the term of this patent is extended or adjusted under 35 U.S.C. 154(b) by 0 days.

(21) Appl. No.: 15/704,617

(22) Filed: Sep. 14, 2017

(65) Prior Publication Data
US 2018/0254353 A1 Sep. 6, 2018

(30) Foreign Application Priority Data

Mar. 1, 2017 (FR) ...................................... 17 51665

(51) Int. Cl.
*G11C 17/16* (2006.01)
*H01L 27/12* (2006.01)
*H01L 23/525* (2006.01)
*H01L 27/112* (2006.01)
(Continued)

(52) U.S. Cl.
CPC .......... *H01L 29/8605* (2013.01); *G11C 17/16* (2013.01); *H01L 23/5256* (2013.01);
(Continued)

(58) Field of Classification Search
CPC ............. H01L 29/8611; H01L 29/8613; H01L 29/8605; H01L 29/66136; H01L 29/66166;
(Continued)

(56) References Cited

U.S. PATENT DOCUMENTS 6,580,156 B1 * 6/2003 Ito ........................ H01L 23/5256
257/173
6,621,138 B1 * 9/2003 Alter .................... H01L 23/5252
257/530
(Continued)

FOREIGN PATENT DOCUMENTS

CN 103107159 A 5/2013
FR 2422224 A1 11/1979
(Continued)

OTHER PUBLICATIONS

INPI Search Report and Written Opinion for FR 1751665 dated Dec. 11, 2017 (8 pages).

*Primary Examiner* — Marc Anthony Armand
*Assistant Examiner* — Younes Boulghassoul
(74) *Attorney, Agent, or Firm* — Crowe & Dunlevy (57) ABSTRACT

A fuse device is formed by a PN junction semiconducting region that is electrically insulated from other portions of an integrated circuit. The fuse device includes a first semiconducting zone having P type of conductivity and a second semiconducting zone having N type of conductivity in contact at a PN junction. First and second electrically conducting contact zones are provided on the first and second semiconducting zone, respectively, without making contact with the PN junction. One of the first and second semiconducting zones is configured with a non-homogeneous concentration of dopants, where a region with a lower value of concentration of dopant is located at the PN junction and a region with a higher value of concentration of dopant is locates at the corresponding electrically conducting contact zone.

58 Claims, 4 Drawing Sheets

(51) Int. Cl.
*H01L 29/8605* (2006.01)
*H01L 27/06* (2006.01)
*H01L 29/06* (2006.01)

(52) U.S. Cl.
CPC .... *H01L 27/0629* (2013.01); *H01L 27/11206* (2013.01); *H01L 27/1203* (2013.01); *H01L 29/0649* (2013.01)

(58) Field of Classification Search
CPC ............. H01L 23/5256; H01L 23/62; H01L 27/11206; H01L 2924/12036; H01L 23/5252; H01L 29/868; H01L 29/866; H01L 27/0629; G11C 17/16
USPC ........................................................ 257/529
See application file for complete search history.

(56) References Cited

U.S. PATENT DOCUMENTS

| | | | | |
|---|---|---|---|---|
| 8,809,997 B2* | 8/2014 | Cho | .................... | H01L 23/5256 257/209 |
| 9,331,211 B2* | 5/2016 | Stribley | .............. | H01L 23/5252 |
| 2006/0065946 A1* | 3/2006 | Mehrad | ............... | H01L 23/5256 257/530 |
| 2007/0099326 A1* | 5/2007 | Hsu | ..................... | H01L 23/5252 438/48 |
| 2007/0222027 A1* | 9/2007 | Yang | ................... | H01L 23/5256 257/529 |
| 2008/0258255 A1* | 10/2008 | Ker | ..................... | H01L 23/5256 257/529 |
| 2008/0296727 A1 | 12/2008 | Vasiliu | | |
| 2008/0298112 A1* | 12/2008 | Vasiliu | .................. | G11C 17/06 365/96 |
| 2012/0112311 A1* | 5/2012 | Cho | ........................ | H01L 23/62 257/529 |
| 2012/0211747 A1* | 8/2012 | Stribley | .............. | H01L 23/5252 257/49 |
| 2012/0314473 A1* | 12/2012 | Chung | ................ | G11C 11/5678 365/96 |

FOREIGN PATENT DOCUMENTS

| | | |
|---|---|---|
| JP | 2003188258 A | 7/2003 |
| WO | WO-2011023922 A1 | 3/2011 |

\* cited by examiner

PN JUNCTION-BASED ELECTRICAL FUSE USING REVERSE-BIAS BREAKDOWN TO INDUCE AN OPEN CONDUCTION STATE

PRIORITY CLAIM

This application claims the priority benefit of French Application for Patent No. 1751665, filed on Mar. 1, 2017, the disclosure of which is hereby incorporated by reference in its entirety to the maximum extent allowable by law.

TECHNICAL FIELD

Embodiments of the invention relate to integrated circuits and more particularly to fuse devices (or simply "fuses").

BACKGROUND

A fuse device is conventionally a device which naturally possesses an electrically passing or closed state (in which it permits a current to pass and thus behaves as a closed switch) and also an electrically open state (in which it behaves as an open switch (to within possible current leaks)).

The fuse device passes from its electrically passing state to its electrically open state in the presence of a trigger event and this passage is irreversible, that is to say that the fuse device having passed to its electrically open state cannot return to the electrically passing state.

Fuse devices find numerous applications in electronics and make it possible to adjust capacitive and/or resistive values, in particular after production of the integrated circuit. In this regard it is, for example, possible to produce a network of capacitors connected in parallel by way of fuse devices that will be rendered selectively open as a function of the desired capacitance final value.

Among the possible applications may be cited, without limitation, the circuits of memories, in particular EEPROM memories, within which adjustments ("trimming") of capacitances are carried out.

At present a conventional solution for producing a fuse device consists in using a metal line (naturally electrically passing) that is melted locally with the aid of a laser beam so as to cause the fuse to pass to its open state. However such a technique requires an additional item of equipment (i.e., the laser) and additional method steps.

A need exists to simplify the production and the implementation of fuse devices within integrated circuits.

SUMMARY

According to embodiments there is proposed a totally different structure of fuse device possessing a naturally electrically passing state and capable of being placed in an electrically open state by modifying its electronic behaviour.

According to one embodiment it is proposed to use as fuse element a PN junction or diode which is non-ideal and leaky in its reverse operating mode exhibiting a very low resistance, thereby conferring on it an electrically passing state. On the other hand after programming, that is to say after applying a sufficient reverse bias voltage, the diode no longer behaves as a diode but as a resistive element exhibiting a particularly high resistive value.

Thus, according to one aspect there is proposed an integrated circuit comprising at least one fuse device configured to pass from an electrically closed state to an electrically open state.

The fuse device comprises a PN junction semiconducting region electrically insulated from the remainder of the integrated circuit and configured to operate in its reverse mode upon applying a reverse bias voltage smaller than a voltage threshold, the fuse device then being in its electrically closed state, and to behave, after applying a reverse bias voltage greater than or equal to the voltage threshold, as a resistance of sufficiently high value such that the fuse device is considered to be in its electrically open mode.

As a function of the applications, and in particular as a function of the voltages used in the integrated circuit, the person skilled in the art will know how to configure the junction region so as to obtain, for the application and the voltages envisaged, a resistance value sufficiently high to consider the fuse device as being in its electrically open mode, that is to say exhibiting a negligible leakage current.

Thus, by way of a non-limiting example, in the electrically open mode the PN junction semiconducting region is configured such that the value of the resistance can be between about 1 Megohm and about 50 Megohms, for example for voltages of the order of 1 to a few volts, in particular 5 volts.

According to one embodiment, the PN junction semiconducting region is configured such that the ratio between the value of the resistance in the electrically open mode and the value of the resistance of the PN junction in its reverse operating mode is between about $10^6$ and about $5 \times 10^8$.

According to one embodiment, the PN junction semiconducting region is configured such that the evolution curve of the level of the current passing through the PN junction when it is reverse biased increases with the reverse bias voltage until the reverse bias voltage remains less than the voltage threshold, the fuse device then being in its electrically closed state, and then drops sharply beneath a first current threshold when the reverse bias voltage reaches the voltage threshold.

At this instant the junction region PN no longer behaves as a diode but the electrical behavior of the junction region has been modified in an irreversible manner so as to behave as a resistance of large value.

More particularly, the PN junction semiconducting region is configured such that the ratio between the level of the current just before the drop and the first current threshold, that is to say just after the drop, is between about $10^8$ and about $10^{12}$.

A non-limiting exemplary structure making it possible to obtain the effects mentioned hereinabove is as follows: the PN junction semiconducting region comprises: a first semiconducting zone having a first type of conductivity P and a second semiconducting zone having a second type of conductivity N opposite to the first type of conductivity, forming at their interface a PN junction, a first electrically conducting contact zone on the first semiconducting zone, a second electrically conducting contact zone on the second semiconducting zone, the PN junction not being in contact with the two contact zones and one at least of the first and second zones having a non-homogeneous concentration of dopants with a lower value of concentration at the level of the junction than at the level of the corresponding contact zone.

In a first variant, that zone of the two zones which exhibits a non-homogeneous concentration of dopants can be of P type of conductivity.

In this first variant, according to one embodiment, the first semiconducting zone comprises a first domain, for example P+ doped, and a second domain which is less strongly doped than the first domain, for example P doped, the second domain being disposed in contact between the first domain of the first zone and the second zone, for example N+ doped, the PN junction being formed between the second domain and the second zone, and the two contact zones are situated respectively on the first domain and on the second zone.

That said, it is preferable in certain cases for that one zone of the two zones which exhibits a non-homogeneous concentration of dopants to be of N type of conductivity. This other variant makes it possible in particular to have a lower value for the voltage threshold which causes the sharp drop in current.

In this other variant, according to one embodiment, the second semiconducting zone comprises a first domain, for example N+ doped, and a second domain which is less strongly doped than the first domain, for example N doped, the second domain being disposed in contact between the first domain of the second zone and the first zone, for example P+ doped, the PN junction being formed between the second domain and the first zone, and the two contact zones are situated respectively on the first domain and on the first zone.

The effects mentioned hereinabove can be obtained whatever the concentration of dopants of the second domain. That said, to obtain industrially acceptable effects with in particular a voltage threshold which is not too high and is compatible with the technologies employed in integrated circuits, typically a voltage threshold of less than 15 volts, the concentration of dopants of the second domain is advantageously greater than or equal to 5c/10 and less than or equal to 5c/10, where c is the concentration of dopants of the first domain.

Likewise, the length of the second domain influences the value of the voltage threshold.

Hence, here again to obtain industrially acceptable effects with in particular a voltage threshold which is not too high and is compatible with the technologies employed in integrated circuits, typically a voltage threshold of less than 15 volts, the length of the second domain is advantageously greater than or equal to 0.5 micrometers and advantageously less than or equal to 2.5 micrometers.

The junction semiconducting region is advantageously insulated from the substrate of the integrated circuit by an insulating region. This makes it possible for the operation of the fuse device not to be disturbed by parasitic diodes due to the presence of the substrate.

The junction semiconducting region can comprise a doped polysilicon bar lying on an insulating region of the shallow trench type (STI: Shallow Trench Insulation). This makes it possible to insulate the junction semiconducting region from a massive substrate or from a well.

The thickness of the junction semiconducting region can then be between 2 micrometers and 2.5 micrometers.

As a variant, the substrate can be of the silicon on insulator type (SOI: Silicon On Insulator) comprising a carrier substrate, a buried insulating layer situated on the carrier substrate and a semiconducting film lying on the buried insulating layer, and the junction semiconducting region is then a doped part of the semiconducting film, lies on the buried insulating layer and is laterally insulated from the remainder of the semiconducting film, for example by shallow trenches.

According to another aspect there is proposed an integrated circuit comprising at least one fuse device configured to pass from an electrically closed state to an electrically open state, in which the fuse device comprises a PN junction semiconducting region, electrically insulated from the remainder of the integrated circuit and comprising a first semiconducting zone having a first type of conductivity P, a second semiconducting zone having a second type of conductivity N opposite to the first type of conductivity, forming at their interface a PN junction, a first electrically conducting contact zone on the first semiconducting zone, a second electrically conducting contact zone on the second semiconducting zone, the PN junction not being in contact with the two contact zones, one at least of the first and second zones having a non-homogeneous concentration of dopants with a lower value of concentration at the level of the junction than at the level of the corresponding contact zone.

Such a fuse device can also be configured to store a binary information item whose logic value depends on the state, passing or open, of the device. And this state can be readily determined with the aid of a reading circuit, for example a measurement logic circuit which will determine the current passing through the device by applying a reading voltage to the two contact zones.

When the integrated circuit comprises several fuse devices, they can for example store a digital word, for example but without limitation, an identifier of the integrated circuit. In this case the reading circuit is configured to detect the state of each of these fuse devices.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION

Figure 1:
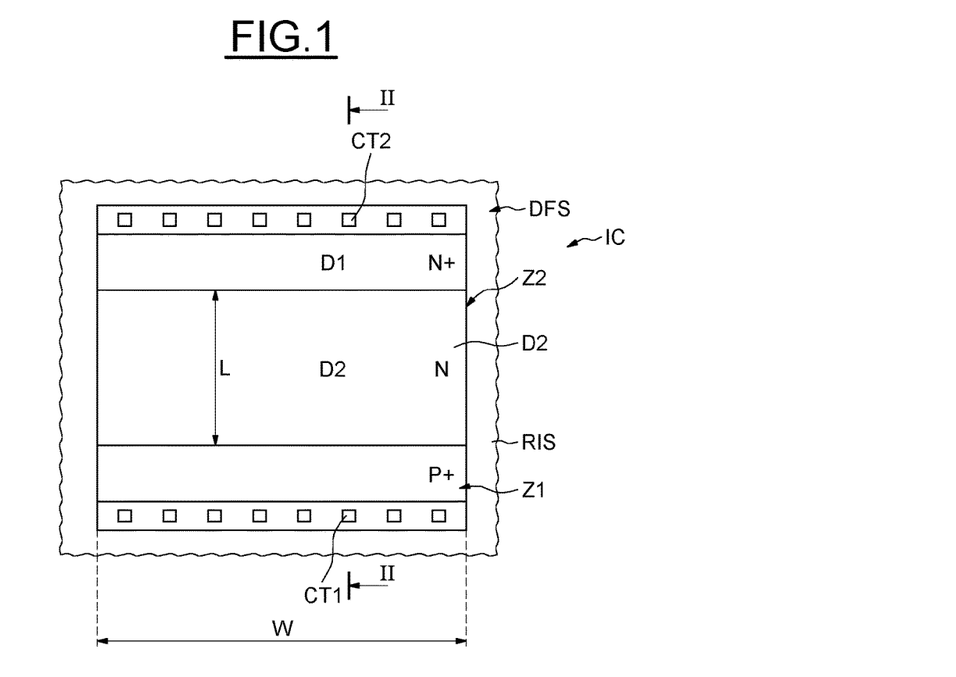
FIGS. 1 and 2 are top and cross-section views of an integrated circuit fuse.
Figure 2:
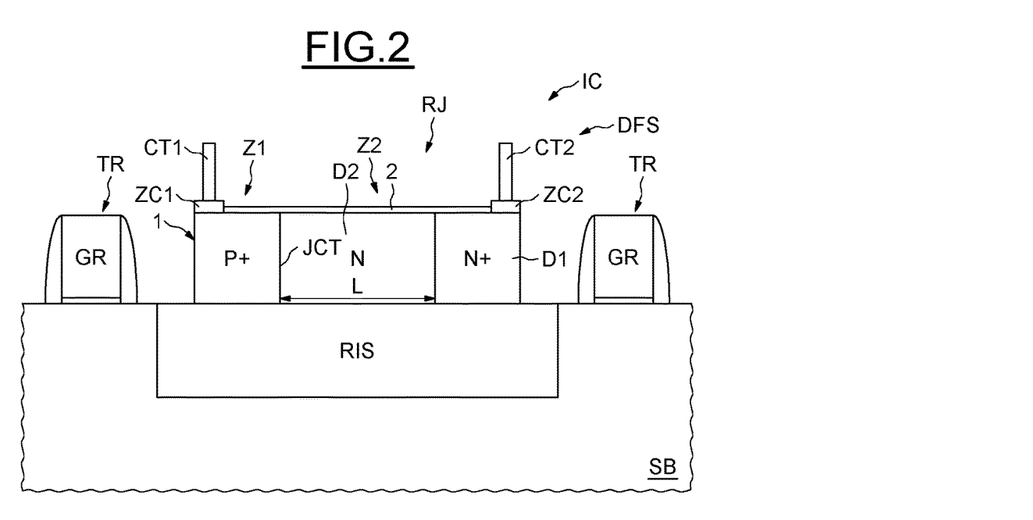

In FIGS. 1 and 2, the reference IC designates an integrated circuit comprising a fuse device DFS located above an insulation region RIS, here a shallow trench that is to say a trench typically having a depth of between 250 nm and 400 nm.

The shallow trench RIS is made in a semiconductor substrate SB in and on which other components of the integrated circuit, such as for example transistors TR, may be produced.

FIG. 2 is a sectional view on the line II-II of FIG. 1 in which, for the sake of simplification, the transistors TR have not been represented.

The fuse device comprises a PN junction semiconducting region, referenced RJ, electrically insulated from the remainder of the integrated circuit IC.

Indeed, in the example described here, the junction semiconducting region RJ is situated above the insulating region RIS and comprises a polysilicon bar doped according to a doping configuration which will be detailed in greater detail hereinafter.

The polysilicon bar is laterally insulated from the other components of the integrated circuit, in this instance the transistors TR, by another insulating region, typically a dielectric material commonly referred to by the person skilled in the art by the expression PMD (Pre-Metal Dielectric).

Moreover, as is conventional in the fabrication of the integrated circuit, the polysilicon bar RJ is covered with an insulating protection layer 2 (generally referred to by the person skilled in the art by the expression "SiProt layer".

The thickness of the junction semiconducting region RJ is for example between 1000 Ångströms and 2500 Ångströms and can be equal to 2000 Ångströms. This thickness corresponds moreover advantageously to the height of the gates GR of the transistors TR.

It is not absolutely necessary that the junction semiconducting region RJ lies on a region RIS of the shallow trench type. Indeed, this region RJ could also be situated directly above the substrate SB. In this embodiment, an insulating layer (typically a silicon dioxide layer which is customarily present in the fabrication of integrated circuits) is disposed between the substrate SB and the region RJ.

In the example described in FIGS. 1 and 2, the PN junction semiconducting region referenced RJ comprises a first semiconducting zone Z1 having the P type of conductivity and P+ doped. Typically, for a thickness of region RJ of the order of 2500 Ångströms, the concentration of dopants in the first zone Z1 is of the order of $10^{20}$ atoms/cm$^3$ and has been, for example, obtained on the basis of a boron implantation with a dose of the order of $2.5 \times 10^{15}$ atoms/cm$^2$.

The semiconducting region RJ moreover comprises a second semiconducting zone Z2 having the N type of conductivity.

The first zone Z1 and the second zone Z2 are in contact and form at their interface a PN junction referenced JCT.

The fuse device DFS moreover comprises a first electrically conducting contact zone ZC1 situated on the first semiconducting zone Z1 and a second electrically conducting contact zone ZC2 situated on the second semiconducting zone Z2.

These two contact zones can conventionally be zones comprising a metal silicide.

The contact zones are intended to be coupled to electrically conducting contacts CT1 and CT2 which will make it possible to connect the zones Z1 and Z2 to the first metal level of the interconnection part (commonly referred to by the person skilled in the art by the expression BEOL "Back End Of Line") of the integrated circuit IC.

In a general manner, the junction JCT is not in contact with the two contact zones ZC1 and ZC2 so that it is not short-circuited.

Moreover, in a general manner, one at least of the first and second zones Z1 and Z2 has a non-homogeneous concentration of dopants with a lower value of concentration at the location of the junction JCT than at the location of the corresponding contact zone.

Thus, in the example described here, it is the second zone Z2, of type of conductivity N, which has a non-homogeneous concentration of dopants with a lower concentration of dopants at the location of the junction JCT than at the location of the corresponding contact zone ZC2.

In the example described here, this non-homogeneous concentration of dopants of the second zone Z2 is obtained by producing, by implantation in this second zone Z2, two domains of different concentrations.

More precisely, the second semiconducting zone Z2 comprises a first domain D1 and a second domain D2 which is less strongly doped than the first domain D1.

Thus, in this example, the first domain D1 is N+ doped with a concentration of dopants for example identical to that of the first zone Z1 (i.e., a concentration of the order of $10^{20}$ atoms/cm$^3$ which this time has been obtained by arsenic implantation with a dose of the order of $2.5 \times 10^{15}$ atoms/cm$^2$).

The concentration of dopants of the second domain D2 is here of the order of $4 \times 10^{19}$ atoms/cm$^3$ which has been obtained by arsenic implantation with a dose of the order of $8 \times 10^{14}$ atoms/cm$^2$.

It is therefore seen here that the concentration c2 of dopants of the domain D2 is of the order of 0.4 times the concentration c of dopants of the first domain D1.

This concentration c2 is moreover also less than the concentration of dopants of the first semiconducting zone Z1 so as to preserve a "leaky" diode effect.

In a general manner, the PN junction semiconducting region referenced RJ is configured to operate in its reverse mode upon applying a reverse bias voltage smaller than a voltage threshold, the fuse device then being in an electrically closed state.

Moreover, this junction semiconducting region RJ is also configured to behave, after applying a reverse bias voltage greater than or equal to the voltage threshold, as a resistance of sufficiently high value such that the fuse device is considered to be in its electrically open mode.

Figure 3:
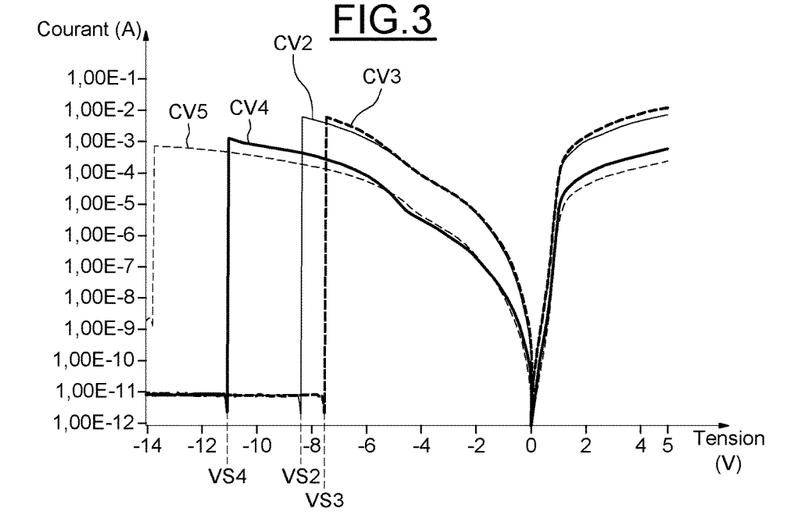
FIG. 3 shows an evolution of current passing through a junction semiconducting region as a function of voltage for the circuit of FIGS. 1-2.
Figure 4:
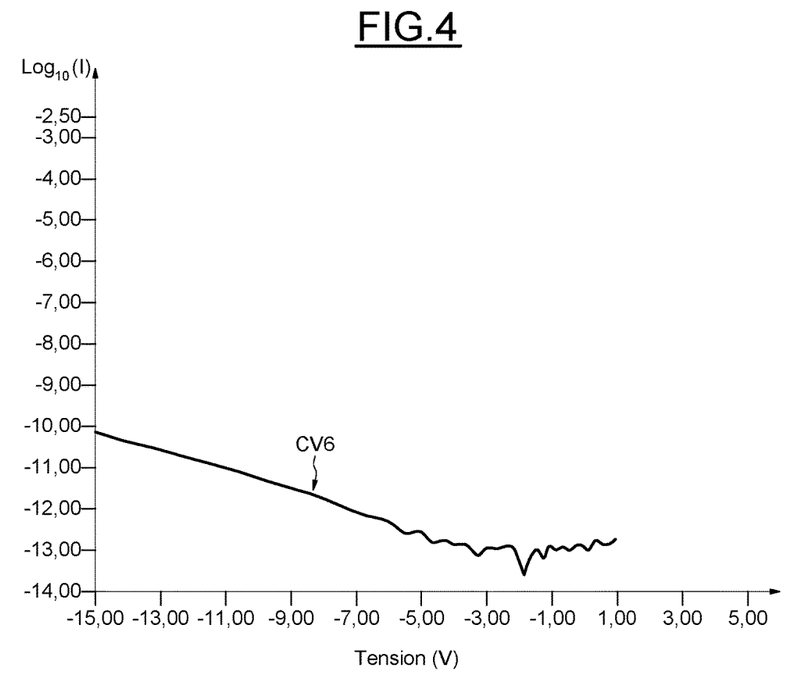
FIG. 4 shows an evolution of the logarithm to base 10 of the current passing through the junction semiconducting region as a function of voltage.

This is illustrated in greater detail in FIGS. 3 and 4.

FIG. 3 represents the evolution of the current passing through the junction semiconducting region RJ as a function of the voltage which is applied between the two contact zones ZC1 and ZC2 for various values of the length L of the second domain D2 and of the width W of the semiconducting region RJ.

As illustrated in FIG. 1, the length L is the distance separating the first domain D1 of the second zone Z2 from the junction JCT while the width W is the transverse dimension of the region RJ reckoned orthogonally to the length L.

The curve CV2 has been plotted for a width W equal to 7.4 microns and a length L equal to 2 microns.

For the curve CV3, W is equal to 7.4 microns and L equal to 1.5 microns.

For the curve CV4, W=0.7 microns and L=2 microns.

For the curve CV5, W=0.35 microns and L=2 microns.

It is seen on these curves that when the junction semiconducting region RJ is forward biased, that is to say when the voltage difference between the contact zone ZC1 and the contact zone ZC2 is positive, this junction semiconducting region behaves as a diode.

On the other hand, in the presence of a reverse bias voltage, that is to say a negative voltage difference applied between the contact zone ZC1 and the contact zone ZC2, the level of the current passing through the PN junction JCT increases with the reverse bias voltage as long as the reverse bias voltage remains below the voltage threshold.

As illustrated in FIG. 3, the voltage threshold VS2 for the curve CV2 is situated in the vicinity of 8.5 volts while the voltage threshold VS3 for the curve CV3 is slightly less than 8 volts and the voltage threshold VS4 for the curve CV4 is situated in the vicinity of 11 volts.

In this operating zone that is to say when the reverse bias voltage is below the voltage threshold VSi, the fuse device is in its electrically closed state.

Next, when the reverse bias voltage reaches the voltage threshold, the level of the current passing through the PN junction drops sharply beneath a first current threshold which is situated in the present case in the vicinity of $10^{-11}$ amperes.

From this instant, the electrical behavior of the junction semiconducting region RJ has been modified and this junction semiconducting region then behaves as a resistance having a very high value, the fuse device is then considered to be in its electrically open mode.

This behavior is illustrated schematically in FIG. 4 which represents an evolution of the logarithm to base 10 of the current I passing through the junction semiconducting region as a function of the voltage applied to its terminals. This evolution is illustrated by the curve CV6.

The PN junction semiconducting region, referenced RJ, is in practice configured such that the ratio between the level of current just before the drop and the first current threshold is between about $10^8$ and about $10^{12}$.

The fuse device DFS structure which has been described in conjunction with FIGS. 1 and 2 is merely a non-limiting exemplary structure making it possible to obtain the electrical effects mentioned hereinabove.

The electrical effects mentioned hereinabove can be obtained in a general manner provided that the length L of the second domain D2 is strictly positive and that the concentration c2 of dopants of the second domain D2 is less than the concentration c of dopants of the first domain D1 of the second semiconducting zone Z2.

That said, these various parameters influence the value of the voltage threshold VSi from which the level of current drops sharply.

It is thus noted that for a given width W, the length L of the second domain makes it possible to influence the level of this voltage threshold VSi. Indeed, for one and the same width W, the lower the length L, the lower the level of the voltage threshold VSi will be.

Likewise, to have a voltage threshold VSi acceptable for the applications and the voltages customarily applied to an integrated circuit, that is to say typically to have a voltage threshold of less than 15 volts, it is preferable that the concentration c2 of the second domain D2 be greater than or equal to 30% of the concentration c of the first domain D1 and less than or equal to 50% of this concentration.

Likewise, it is preferable that the length L of the second domain D2 be greater than or equal to 0.5 microns and less than or equal to 2.5 microns.

It is also noted that for one and the same length L of the second domain D2, the width W has an influence on the voltage threshold VSi. Thus, for one and the same length L of the second domain D2, the more W increases the more the threshold VSi decreases with a saturation effect around a value of 5 microns for W.

The person skilled in the art will know to find a compromise between the values of W, of L and of the various concentrations of dopants having regard to the application envisaged to obtain, for example, a device with the smallest possible bulk with the lowest threshold VSi compatible in particular with the technology used.

Moreover, as indicated hereinabove, it is preferable that the concentration c2 of dopants in the second domain D2 be less than the concentration c1 of dopants in the first zone Z1, in particular to obtain a good "leaky" diode effect.

In the exemplary embodiment just described, the second domain D2 had the same type of conductivity as the first domain D1 of the second semiconducting zone Z2.

Figure 5:
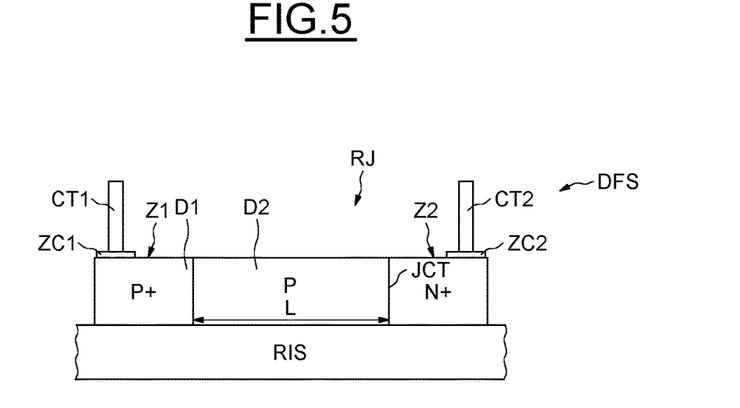
FIG. 5 is a cross-section view of an integrated circuit fuse.

It is, however, entirely possible, as illustrated in FIG. 5, that this time it is the first zone Z1 which comprises a first domain D1 more strongly doped than a second domain D2 which this time will be in contact with the second semiconducting zone Z2.

In this example, the concentration of dopants of the second domain D2 of the first semiconducting zone Z1 can also be, for example, of the order of $4 \times 10^{19}$ atoms/cm$^3$ and obtained by a boron implantation.

The concentrations of dopants of the first domain D1 of the first semiconducting zone Z1 and of the second semiconducting zone Z2 can moreover be equal to $10^{20}$ atoms/cm$^3$.

The preferential conditions alluded to hereinabove for in particular the length L of the second domain D2 and for the concentration c1 of this second domain D2 with respect to the concentration c of the first domain D1 of the first semiconducting zone Z1 are identical to those mentioned hereinabove.

Figure 6:
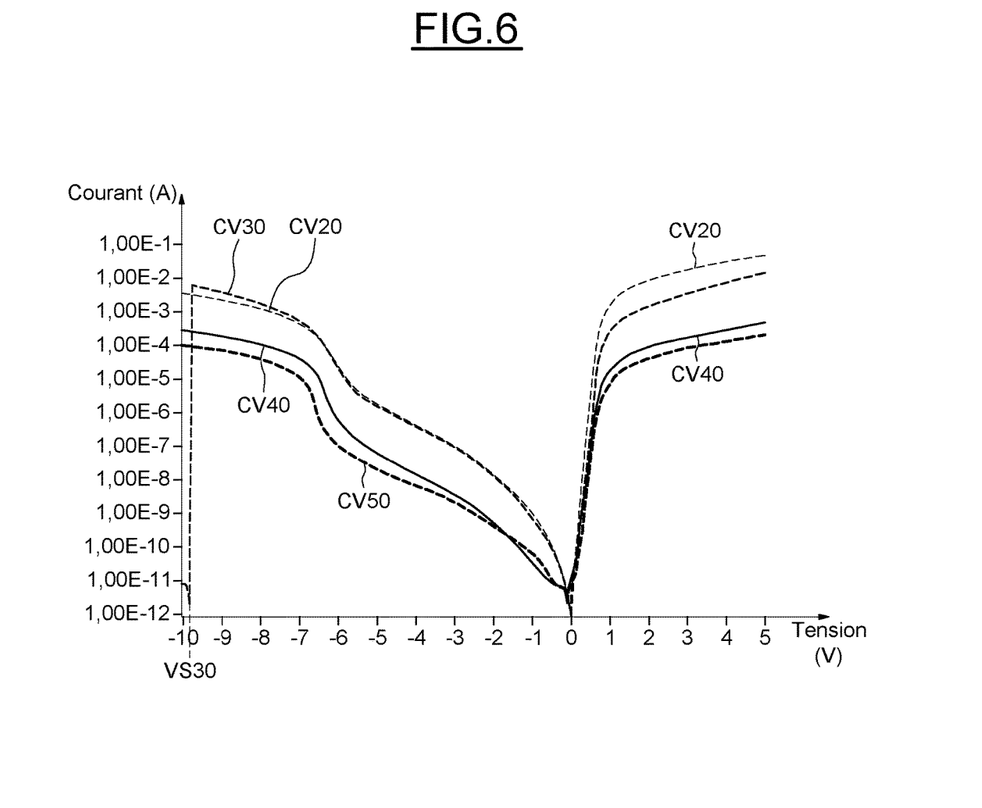
FIG. 6 shows an evolution of current passing through a junction semiconducting region as a function of voltage for the circuit of FIG. 5.

That said, as seen in FIG. 6 which represents here again current voltage curves like the curves illustrated in FIG. 3, the voltage threshold causing the drop in current is more considerable for an embodiment in which the conductivity of the second domain D2 is of P type. It is noted that the voltage threshold VSi is shifted towards the left, that is to say that it occurs at higher voltage thresholds. This is seen in particular for the curve CV30 for which the voltage threshold VS30 is situated in the vicinity of 10 volts while the corresponding threshold VS3 is less than 8 volts.

In the exemplary embodiments just described, the junction semiconducting region RJ comprised a doped polysilicon bar lying on an insulating region RIS.

Figure 7:
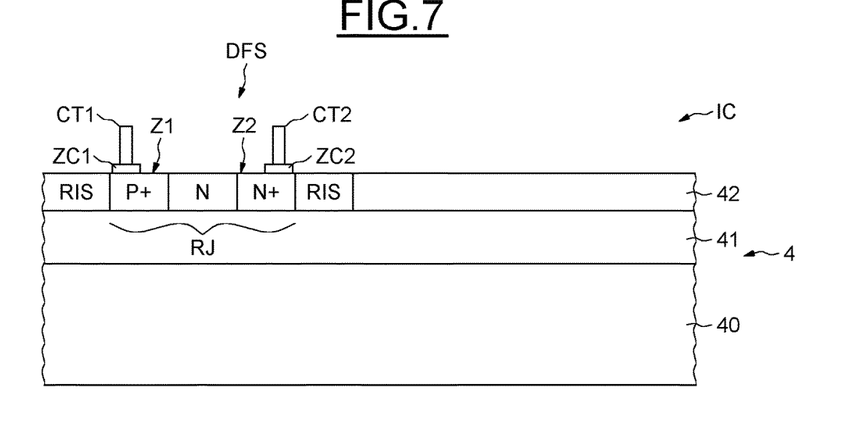
FIG. 7 is a cross-section view of an integrated circuit fuse.

That said, it is possible, as illustrated in FIG. 7, to provide an integrated circuit whose substrate is of the Silicon on Insulator (SOI) type comprising a carrier substrate 40, a buried insulating layer 41 commonly referred to by the person skilled in the art by the expression "BOX", and a semiconducting film 42 lying on the buried insulating layer 41.

In this case, as illustrated in FIG. 7, the junction semiconducting region RJ of the fuse device DFS can be a doped part of the semiconducting film, lying on the buried insulating layer 41 and laterally insulated from the remainder of the semiconducting film by insulating regions RIS, for example of the shallow trench type.

Thus, the junction semiconducting region remains totally insulated from the remainder of the integrated circuit, and in particular the semiconducting film 42 and the carrier substrate 40.

As a function of the thickness of the semiconducting film 42, it is naturally possible, in particular when the film is very fine, as is the case in a technology of the Fully Depleted Silicon On Insulator (FDSOI) type that the first zones Z1 and Z2 are elevated by epitaxy so as to allow easy pick-up of contact on these zones.

It should be noted that the placement of the fuse device on a shallow trench (FIG. 2) or on the "BOX" layer 41 offers the advantage of having the fuse device lie on an oxide region sufficiently thick to minimize or indeed eliminate undesirable effects in the subjacent substrate upon applying the voltage which is applied between the two contact zones ZC1 and ZC2 when this voltage reaches the voltage threshold VSi.

The fuse device finds numerous applications.

Figure 8:
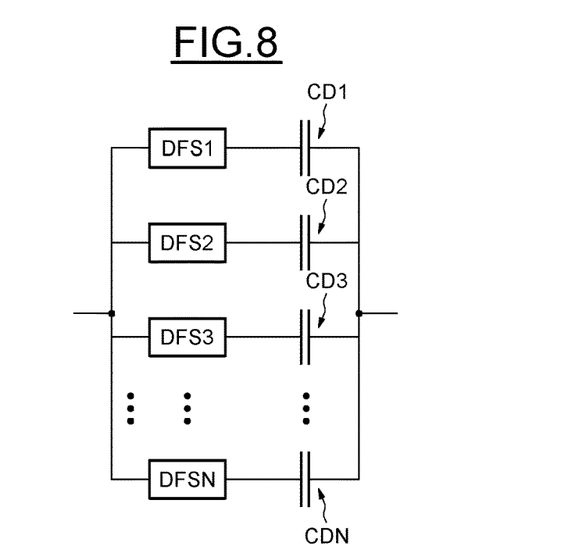
FIG. 8 shows use of fuse circuits to perform an adjustment (trimming) of capacitive values.

Thus, it is possible, as illustrated in FIG. 8, to perform an adjustment (trimming) of capacitive values (for example).

Thus, as illustrated in FIG. 8, it is possible to dispose several capacitors CD1-CDN in parallel each connected in series with a fuse device DFSi.

Additionally, as a function of the open or closed state of the fuse device, it is possible to adjust the total capacitive value of the capacitive network.

It is also possible to use the fuse device as device capable of storing a binary information item whose logic value depends on the state of the device.

Thus, for example, if the device DFSi is in a passing state, the stored logic value can be equal to 1 whereas it is then equal to 0 if the fuse device is in an open state.

Figure 9:
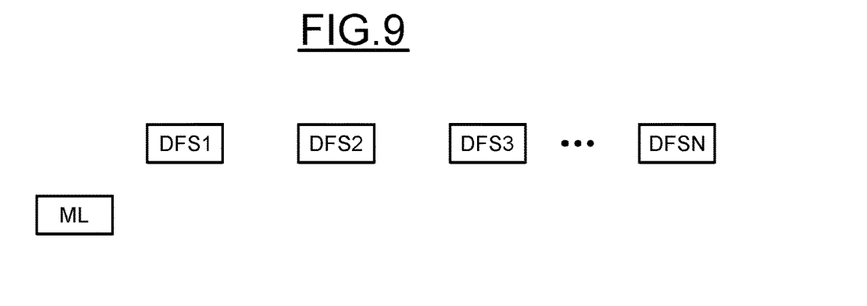
FIG. 9 shows use of fuse circuits to store a digital word.

It is then possible to make provision as illustrated in FIG. 9, for the integrated circuit to comprise a set of fuse devices that are configured to store a digital word together. This digital word may be for example an integrated circuit identifier without this example being limiting. Additionally, in this case, the integrated circuit can comprise a reading circuit ML configured to detect the state of each fuse device.

This reading circuit can be of conventional structure known per se and be intended for example to measure the value of the current passing through the fuse device so as to determine its closed or open state and consequently the logic value of the bit of that corresponding of the digital word.

The invention claimed is:

1. An integrated circuit, comprising a fuse device configured to pass from an electrically closed state to an electrically open state, wherein the fuse device comprises an electrically insulated PN junction semiconducting region that is configured to operate in a reverse mode in response to application of a reverse bias voltage, the PN junction operating to permit current flow there through when the applied reverse bias voltage is smaller than a voltage threshold, and further the PN junction operating with a sufficiently high resistance value to block current flow there through when the applied reverse bias voltage is greater than or equal to the voltage threshold.

2. The integrated circuit according to claim 1, wherein the sufficiently high resistance value in the electrically open state is a resistance between about 1 Megaohm and about 50 Megaohm.

3. The integrated circuit according to claim 1, wherein a ratio between the sufficiently high resistance value in the electrically open state and a resistance value in the electrically closed state is between about $10^6$ and about $5 \times 10^8$.

4. The integrated circuit according to claim 1, wherein the PN junction semiconducting region is configured such that an evolution curve of a level of the current passing through the PN junction in response to the reverse bias voltage increases with increase of the reverse bias voltage while the reverse bias voltage remains less than the voltage threshold and the fuse device operates in the electrically closed state, and then drops sharply beneath a first current threshold when the reverse bias voltage reaches the voltage threshold and the fuse device operates in the electrically open state.

5. The integrated circuit according to claim 4, wherein a ratio of current in the PN junction semiconducting region just before the drop and at the first current threshold is between about $10^8$ and about $10^{12}$.

6. The integrated circuit according to claim 1, wherein the PN junction semiconducting region comprises:
a first semiconducting zone having a first type of conductivity P; and
a second semiconducting zone having a second type of conductivity N, opposite to the first type of conductivity, in contact with the first semiconducting zone at the PN junction;
a first electrically conducting contact zone on the first semiconducting zone; and
a second electrically conducting contact zone on the second semiconducting zone;
wherein the PN junction is not in contact with either of the first or second electrically conducting contact zones.

7. The integrated circuit according to claim 6, wherein one the first and second semiconducting zones has a non-homogeneous concentration of dopants with a lower value of concentration at the location of the PN junction and a higher value of concentration at the location of the corresponding electrically conducting contact zone.

8. The integrated circuit according to claim 7, wherein the lower value of concentration at the location of the PN junction is a P doped region.

9. The integrated circuit according to claim 7, wherein the lower value of concentration at the location of the PN junction is an N doped region.

10. The integrated circuit according to claim 7, wherein the lower value of concentration is greater than or equal to c/10 and less than or equal to 3c/10, where c is the higher value of concentration.

11. The integrated circuit according to claim 1, further comprising a semiconductor substrate and a trench isolation formed in the semiconductor substrate, wherein the electrically insulated PN junction semiconducting region is located on a top surface of the trench isolation.

12. The integrated circuit according to claim 1, further comprising a semiconductor substrate layer and a buried oxide layer, wherein the electrically insulated PN junction semiconducting region is located in the semiconductor substrate layer on a top surface of the buried oxide layer and laterally insulated by a trench isolation.

13. The integrated circuit according to claim 1, where the fuse device is configured to store a binary information item whose logic value depends on the state of the fuse device.

14. The integrated circuit according to claim 1, comprising several fuse devices.

15. The integrated circuit according to claim 14, where the several fuse devices are configured to store a digital word.

16. The integrated circuit according to claim 1, further comprising a reading circuit configured to detect a state of the fuse device.

17. An integrated circuit including a fuse device configured to pass from an electrically closed state to an electrically open state, the fuse device comprising:
an electrically insulated PN junction semiconducting region comprising a first semiconducting zone having a first type of conductivity P and a second semiconducting zone having a second type of conductivity N, opposite to the first type of conductivity, which form a PN junction,
a first electrically conducting contact zone on the first semiconducting zone,
a second electrically conducting contact zone on the second semiconducting zone,
wherein the PN junction is not in contact with the first and second electrically conducting contact zones,
wherein the second semiconducting zone has a non-homogeneous concentration of dopants with a lower value of concentration at the location of the PN junction and a higher value of concentration at the location of the corresponding electrically conducting contact zone;

the second semiconducting zone comprises a first domain and a second domain which is less strongly doped than the first domain, the second domain being disposed in contact between the first domain of the second semiconducting zone and the first semiconducting zone, the PN junction formed between the second domain and the first semiconducting zone, and wherein the first and second electrically conducting contact zones are situated respectively on the first domain and on the first semiconducting zone;

wherein a concentration of dopants of the second domain is greater than or equal to c/10 and less than or equal to 3c/10, where c is a concentration of dopants of the first domain.

18. The integrated circuit according to claim 17, wherein a length of the second domain is greater than or equal to 0.5 micrometers and less than or equal to 2.5 micrometers.

19. The integrated circuit according to claim 17, wherein a thickness of the electrically insulated PN junction semiconducting region is between 2 micrometers and 2.5 micrometers.

20. The integrated circuit according to claim 17, further comprising a substrate and wherein the electrically insulated PN junction semiconducting region is insulated from the substrate by an insulating region.

21. The integrated circuit according to claim 20, wherein the electrically insulated PN junction semiconducting region comprises a doped polysilicon bar lying on the insulating region, and wherein in the insulating region is a shallow trench type insulation.

22. The integrated circuit according to claim 20, wherein the substrate is of a silicon on insulator type comprising a carrier substrate, a buried insulating layer situated on the carrier substrate and a semiconducting film lying on the buried insulating layer, and wherein the electrically insulated PN junction semiconducting region is a doped part of the semiconducting film which lies on the buried insulating layer and is laterally insulated from a remaining portion of the semiconducting film.

23. The integrated circuit according to claim 17, where the fuse device is configured to store a binary information item whose logic value depends on the state of the fuse device.

24. The integrated circuit according to claim 17, comprising several fuse devices.

25. The integrated circuit according to claim 24, where the several fuse devices are configured to store a digital word.

26. The integrated circuit according to claim 17, further comprising a reading circuit configured to detect a state of the fuse device.

27. An integrated circuit including a fuse device configured to pass from an electrically closed state to an electrically open state, the fuse device comprising:

an electrically insulated PN junction semiconducting region comprising a first semiconducting zone having a first type of conductivity P and a second semiconducting zone having a second type of conductivity N, opposite to the first type of conductivity, which form a PN junction, a first electrically conducting contact zone on the first semiconducting zone, a second electrically conducting contact zone on the second semiconducting zone, wherein the PN junction is not in contact with the first and second electrically conducting contact zones, wherein the first semiconducting zone has a non-homogeneous concentration of dopants with a lower value of concentration at the location of the PN junction and a higher value of concentration at the location of the corresponding electrically conducting contact zone;

the first semiconducting zone comprising a first domain and a second domain which is less strongly doped than the first domain, the second domain being disposed in contact between the first domain of the first semiconducting zone and the second semiconducting zone, the PN junction formed between the second domain and the second semiconducting zone, and wherein the first and second electrically conducting contact zones are situated respectively on the first domain and on the second semiconducting zone;

wherein a concentration of dopants of the second domain is greater than or equal to c/10 and less than or equal to 3c/10, where c is a concentration of dopants of the first domain.

28. The integrated circuit according to claim 27, wherein a length of the second domain is greater than or equal to 0.5 micrometers and less than or equal to 2.5 micrometers.

29. The integrated circuit according to claim 27, wherein a thickness of the electrically insulated PN junction semiconducting region is between 2 micrometers and 2.5 micrometers.

30. The integrated circuit according to claim 27, further comprising a substrate and wherein the electrically insulated PN junction semiconducting region is insulated from the substrate by an insulating region.

31. The integrated circuit according to claim 30, wherein the electrically insulated PN junction semiconducting region comprises a doped polysilicon bar lying on the insulating region, and wherein in the insulating region is a shallow trench type insulation.

32. The integrated circuit according to claim 30, wherein the substrate is of a silicon on insulator type comprising a carrier substrate, a buried insulating layer situated on the carrier substrate and a semiconducting film lying on the buried insulating layer, and wherein the electrically insulated PN junction semiconducting region is a doped part of the semiconducting film which lies on the buried insulating layer and is laterally insulated from a remaining portion of the semiconducting film.

33. The integrated circuit according to claim 27, where the fuse device is configured to store a binary information item whose logic value depends on the state of the fuse device.

34. The integrated circuit according to claim 27, comprising several fuse devices.

35. The integrated circuit according to claim 34, where the several fuse devices are configured to store a digital word.

36. The integrated circuit according to claim 27, further comprising a reading circuit configured to detect a state of the fuse device.

37. An integrated circuit, comprising a fuse device configured to pass from an electrically closed state to an electrically open state, wherein the fuse device comprises an electrically insulated PN junction semiconducting region that is configured to operate in a reverse mode in response to application of a reverse bias voltage, the fuse device behaving in the electrically closed state when the applied reverse bias voltage is smaller than a voltage threshold, and further the fuse device behaving in the electrically open state with a sufficiently high resistance value when the applied reverse bias voltage is greater than or equal to the voltage threshold, wherein the PN junction semiconducting region is configured such that an evolution curve of a level of the current passing through the PN junction in response to the reverse bias voltage increases with increase of the reverse bias voltage while the reverse bias voltage remains less than the voltage threshold and the fuse device operates in the electrically closed state, and then drops sharply beneath a first current threshold when the reverse bias voltage reaches the voltage threshold and the fuse device operates in the electrically open state.

38. The integrated circuit according to claim 37, wherein the sufficiently high resistance value in the electrically open state is a resistance between about 1 Megaohm and about 50 Megaohm.

39. The integrated circuit according to claim 37, wherein a ratio between the sufficiently high resistance value in the electrically open state and a resistance value in the electrically closed state is between about $10^6$ and about $5 \times 10^8$.

40. The integrated circuit according to claim 37, wherein a ratio of current in the PN junction semiconducting region just before the drop and at the first current threshold is between about $10^8$ and about $10^{12}$.

41. The integrated circuit according to claim 37, further comprising a semiconductor substrate and a trench isolation formed in the semiconductor substrate, wherein the electrically insulated PN junction semiconducting region is located on a top surface of the trench isolation.

42. The integrated circuit according to claim 37, further comprising a semiconductor substrate layer and a buried oxide layer, wherein the electrically insulated PN junction semiconducting region is located in the semiconductor substrate layer on a top surface of the buried oxide layer and laterally insulated by a trench isolation.

43. The integrated circuit according to claim 37, where the fuse device is configured to store a binary information item whose logic value depends on the state of the fuse device.

44. The integrated circuit according to claim 37, comprising several fuse devices.

45. The integrated circuit according to claim 44, where the several fuse devices are configured to store a digital word.

46. The integrated circuit according to claim 37, further comprising a reading circuit configured to detect a state of the fuse device.

47. An integrated circuit, comprising a fuse device configured to pass from an electrically closed state to an electrically open state, wherein the fuse device comprises an electrically insulated PN junction semiconducting region that is configured to operate in a reverse mode in response to application of a reverse bias voltage, the fuse device behaving in the electrically closed state when the applied reverse bias voltage is smaller than a voltage threshold, and further the fuse device behaving in the electrically open state with a sufficiently high resistance value when the applied reverse bias voltage is greater than or equal to the voltage threshold, wherein the PN junction semiconducting region comprises:
 a first semiconducting zone having a first type of conductivity P; and
 a second semiconducting zone having a second type of conductivity N, opposite to the first type of conductivity, in contact with the first semiconducting zone at the PN junction;
 a first electrically conducting contact zone on the first semiconducting zone; and
 a second electrically conducting contact zone on the second semiconducting zone;
 wherein the PN junction is not in contact with either of the first or second electrically conducting contact zones;
 wherein one the first and second semiconducting zones has a non-homogeneous concentration of dopants with a lower value of concentration at the location of the PN junction and a higher value of concentration at the location of the corresponding electrically conducting contact zone.

48. The integrated circuit according to claim 47, wherein the sufficiently high resistance value in the electrically open state is a resistance between about 1 Megaohm and about 50 Megaohm.

49. The integrated circuit according to claim 47, wherein a ratio between the sufficiently high resistance value in the electrically open state and a resistance value in the electrically closed state is between about $10^6$ and about $5 \times 10^8$.

50. The integrated circuit according to claim 47, wherein the lower value of concentration at the location of the PN junction is a P doped region.

51. The integrated circuit according to claim 47, wherein the lower value of concentration at the location of the PN junction is an N doped region.

52. The integrated circuit according to claim 47, wherein the lower value of concentration is greater than or equal to c/10 and less than or equal to 3c/10, where c is the higher value of concentration.

53. The integrated circuit according to claim 47, further comprising a semiconductor substrate and a trench isolation formed in the semiconductor substrate, wherein the electrically insulated PN junction semiconducting region is located on a top surface of the trench isolation.

54. The integrated circuit according to claim 47, further comprising a semiconductor substrate layer and a buried oxide layer, wherein the electrically insulated PN junction semiconducting region is located in the semiconductor substrate layer on a top surface of the buried oxide layer and laterally insulated by a trench isolation.

55. The integrated circuit according to claim 47, where the fuse device is configured to store a binary information item whose logic value depends on the state of the fuse device.

56. The integrated circuit according to claim 47, comprising several fuse devices.

57. The integrated circuit according to claim 56, where the several fuse devices are configured to store a digital word.

58. The integrated circuit according to claim 47, further comprising a reading circuit configured to detect a state of the fuse device.

* * * * *